United States Patent
Chou

(10) Patent No.: US 7,893,997 B2
(45) Date of Patent: Feb. 22, 2011

(54) METHOD FOR GENERATING VIDEO CLOCK AND ASSOCIATED TARGET IMAGE FRAME

(75) Inventor: Yu Pin Chou, Tongsiao Township, Miaoli County (TW)

(73) Assignee: Realtek Semiconductor Corp., Hsinchu (TW)

( * ) Notice: Subject to any disclaimer, the term of this patent is extended or adjusted under 35 U.S.C. 154(b) by 979 days.

(21) Appl. No.: 11/273,885

(22) Filed: Nov. 15, 2005

(65) Prior Publication Data

US 2006/0103685 A1 May 18, 2006

(30) Foreign Application Priority Data

Nov. 17, 2004 (TW) ............... 93135178 A

(51) Int. Cl.
| H04N 7/01 | (2006.01) |
| H04N 11/20 | (2006.01) |
| H04N 5/08 | (2006.01) |
| H04N 9/74 | (2006.01) |
| H04N 3/14 | (2006.01) |
| H03L 7/00 | (2006.01) |
| G09G 5/02 | (2006.01) |

(52) U.S. Cl. .............. 348/536; 348/441; 348/537; 348/525; 348/581; 348/790; 348/797; 345/698

(58) Field of Classification Search ............ 348/536, 348/537, 441, 581, 525, 790, 797; 345/213, 345/698
See application file for complete search history.

(56) References Cited

U.S. PATENT DOCUMENTS

| 5,739,867 A | 4/1998 | Eglit | |
| 5,790,096 A * | 8/1998 | Hill, Jr. .................. | 345/600 |
| 5,914,757 A * | 6/1999 | Dean et al. ............... | 348/584 |
| 5,933,196 A * | 8/1999 | Hatano et al. ............ | 348/441 |
| 6,130,721 A * | 10/2000 | Yoo et al. ................ | 348/558 |
| 6,480,235 B1 * | 11/2002 | Sugawa et al. ........... | 348/554 |
| 6,522,365 B1 * | 2/2003 | Levantovsky et al. .... | 348/537 |
| 6,532,042 B1 * | 3/2003 | Kim ........................ | 348/537 |
| 6,636,269 B1 * | 10/2003 | Baldwin .................. | 348/500 |
| 6,654,065 B1 * | 11/2003 | Sung ....................... | 348/525 |
| 6,721,016 B1 * | 4/2004 | Hamajima ............... | 348/497 |
| 6,853,354 B2 * | 2/2005 | Asamura ................. | 345/1.1 |
| 6,891,572 B2 * | 5/2005 | Ueki ....................... | 348/458 |
| 7,061,540 B2 * | 6/2006 | Weaver et al. ........... | 348/500 |
| 7,071,992 B2 * | 7/2006 | Chen et al. .............. | 348/441 |
| 7,158,186 B2 * | 1/2007 | Selby et al. ............. | 348/459 |
| 7,193,657 B2 * | 3/2007 | Chida ..................... | 348/458 |
| 7,239,355 B2 * | 7/2007 | Smith et al. ............. | 348/521 |
| 7,289,170 B2 * | 10/2007 | Jun ......................... | 348/790 |

(Continued)

*Primary Examiner*—Brian Yenke
(74) *Attorney, Agent, or Firm*—Thomas, Kayden, Horstemeyer & Risley, LLP

(57) ABSTRACT

A method for generating a video clock and an associated target image frame is disclosed. The method generates an output clock signal for outputting a target image frame to a panel according to a frame pixel number and a vertical synchronization signal (Vsync). The target image frame corresponds to a source image frame. The frame pixel number is the number of total pixels included in a predetermined frame format, and the Vsync signal is an input Vsync signal or an output Vsync signal. The period of the output clock signal is the result of the period of the Vsync divided by the frame pixel number. In this manner, the format of the target image frame can remain substantially fixed, and is substantially equal to the predetermined frame format.

11 Claims, 4 Drawing Sheets

U.S. PATENT DOCUMENTS

| | | | |
|---|---|---|---|
| 7,307,643 B2 * | 12/2007 | Moroo et al. | 345/667 |
| 7,327,400 B1 * | 2/2008 | Greenberg | 348/536 |
| 7,333,149 B2 * | 2/2008 | Choi | 348/441 |
| 7,345,709 B2 * | 3/2008 | Chang et al. | 348/558 |
| 7,359,007 B2 * | 4/2008 | Wu | 348/581 |
| 2002/0005840 A1 * | 1/2002 | Wicker | 345/204 |
| 2005/0012738 A1 * | 1/2005 | Gong et al. | 345/212 |
| 2005/0078126 A1 * | 4/2005 | Park et al. | 345/665 |
| 2006/0152624 A1 * | 7/2006 | Cho et al. | 348/521 |

* cited by examiner

METHOD FOR GENERATING VIDEO CLOCK AND ASSOCIATED TARGET IMAGE FRAME

BACKGROUND OF THE INVENTION (a). Field of the Invention

This invention relates to a digital display device, and more particularly, to a method for generating a video clock for the digital display device.

(b). Description of the Prior Arts

A digital display device, such as liquid crystal display (LCD) monitor and plasma display panel (PDP) monitor, utilizes a display controller for converting received image data into a series of image frames for displaying on its panel. Each image frame includes a plurality of pixels. The display controller generates an output clock for outputting the pixels to the panel. FIG. 1 illustrates a diagram of the frame format. As shown in FIG. 1, a frame includes an image area 11 and a porch area 12. The image area 11 comprises a plurality of active pixels, and the porch area 12 comprises a plurality of inactive pixels, which contain no image data. The display controller outputs an image frame to the panel in accordance with an output vertical synchronization (Vsync) signal and an output enable signal. The frequency of the output vertical synchronization signal is equal to the frame rate. When the output enable signal is "Enable", the active pixels of the image frame are outputted and displayed on the panel. On the contrary, when the output enable signal is "Disable", the inactive pixels of the image frame are outputted. The amount of total pixels (active pixel and inactive pixel) of the image frame multiplied by the period of the output clock is equal to the period of the output vertical synchronization signal.

U.S. Pat. No. 5,739,867 discloses a relationship of an input video clock and an output video clock. However, generally speaking, the input video clock or the output video clock or both may have a jitter or drift and cannot have a fixed period, so an associated image frame cannot be displayed in a fixed format actually. That is, the amount of total pixels of the associated image frame is not fixed in the prior art (i.e., the amount of pixels of the last horizontal line of the image frame is not fixed). In addition, different kinds of panels may have different timing constraints. The timing constraint for a panel means the panel can only receive and identify an image frame with a special frame format (for example, the total amount of pixels of the image frame must be a multiple of four). When the format of a received frame does not match the special frame format, the panel cannot process it accurately. The conventional display controller cannot completely conform to the timing constraints of different kinds of panels.

SUMMARY OF THE INVENTION

It is therefore one of objectives of this invention to provide a method for generating an output clock for outputting received image data to a panel according to a target frame format.

It is therefore one of objectives of this invention to provide a method for generating an output clock for outputting received image data to a panel, thereby conforming to the timing constraint of the panel.

According to an embodiment of this invention, a method for generating an output clock for a panel is provided. The output clock is used to output received image data to the panel. The method comprises: determining a target frame format and a corresponding target number of total pixels, wherein the target frame format comprises a plurality of active and inactive pixels arranged as a plurality of horizontal lines; outputting the received image data to the panel according to the corresponding target number of total pixels and the output clock; and adjusting a frequency of the output clock according to a vertical synchronization signal. A frame format of the received image data which is outputted to the panel is corresponding to the target frame format which includes the target number of total pixels.

DETAILED DESCRIPTION OF THE INVENTION

Figure 1:
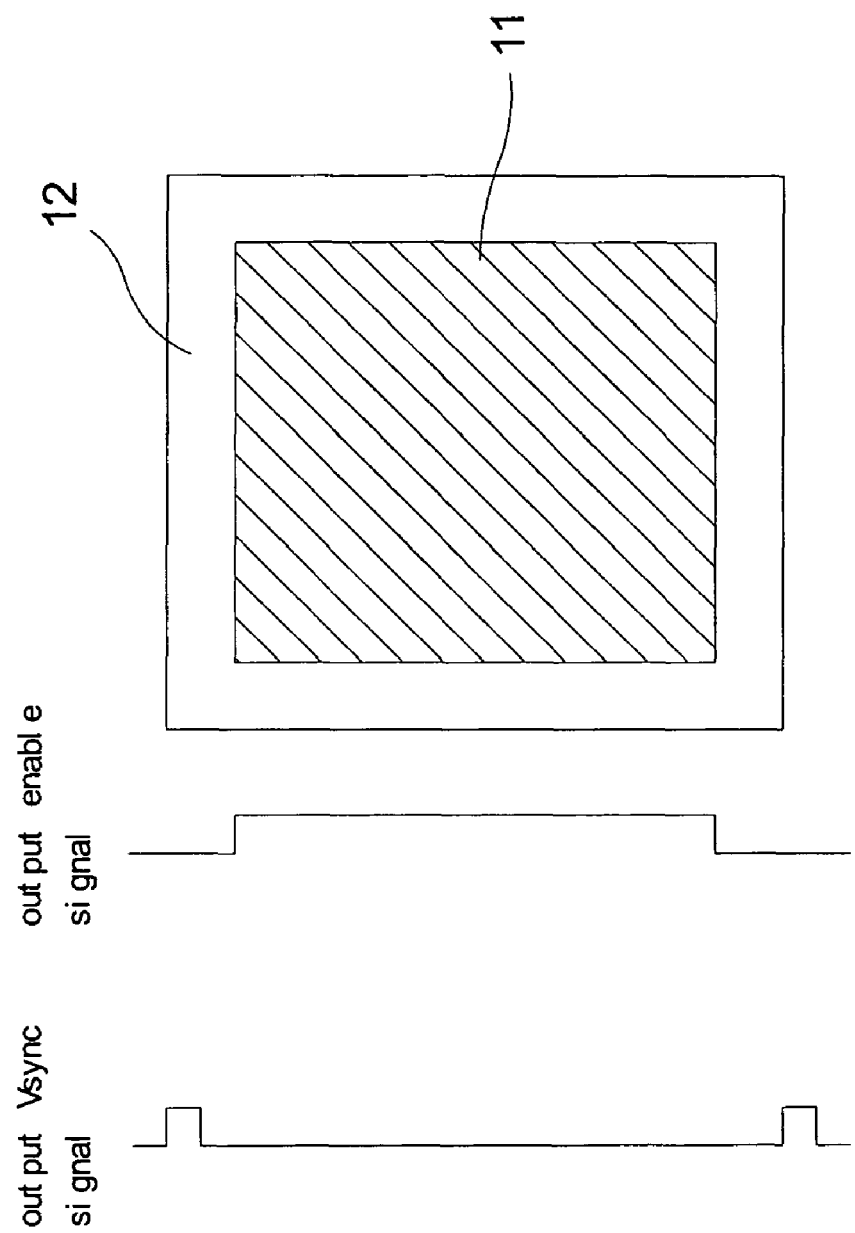
FIG. 1 illustrates a diagram of the frame format.
Figure 2:
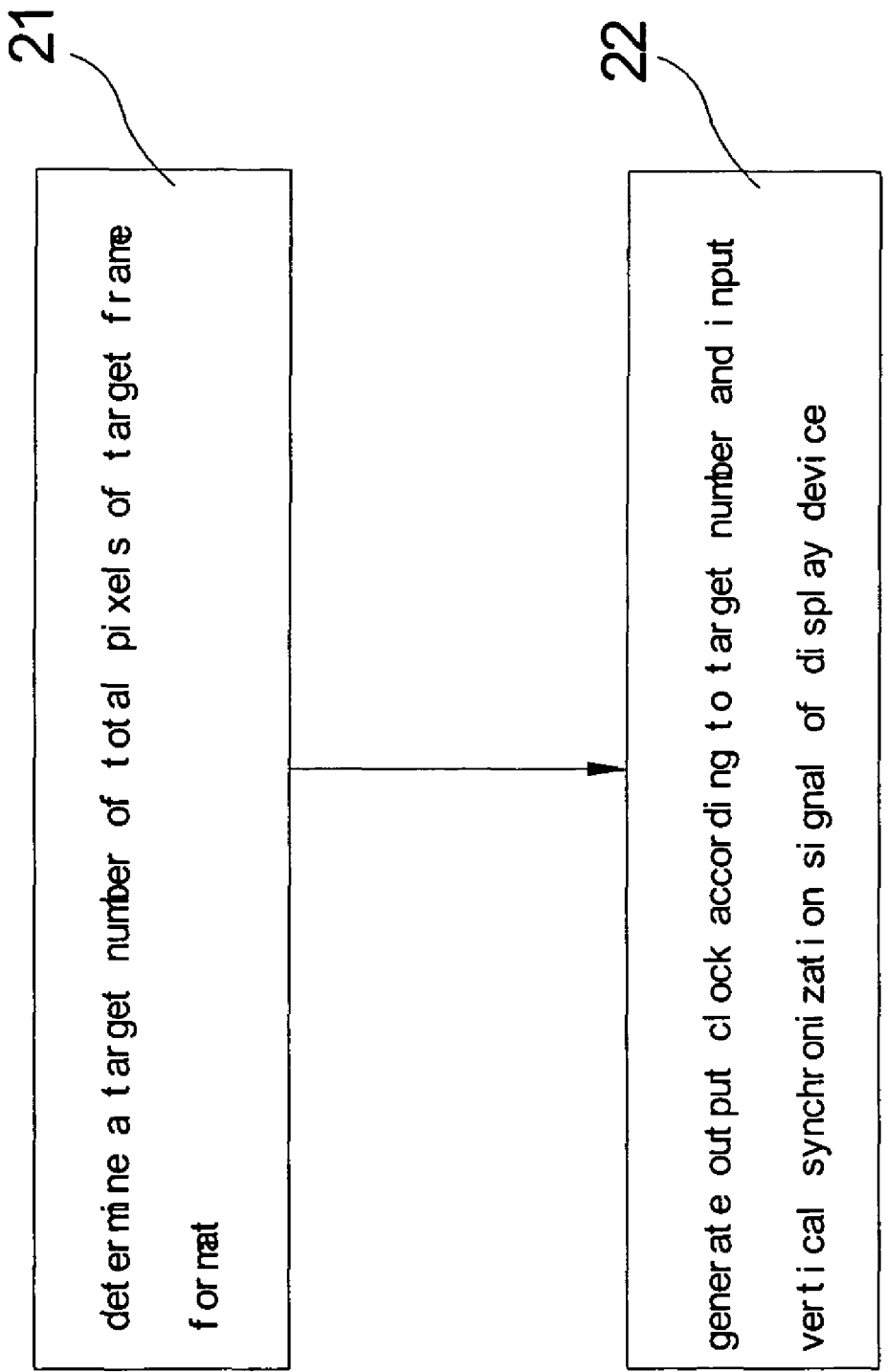
FIG. 2 illustrates a flowchart of a preferred embodiment of the method for generating an output clock for a display device according to the present invention.

FIG. 2 illustrates a flowchart of a preferred embodiment of the method for generating an output video clock for a display device according to the present invention. In this preferred embodiment, the method is used in a display controller of the display device, and the generated output clock is used for outputting received image data to a panel of the display device according to a target frame format. As shown in FIG. 2, the flowchart comprises the steps of:

Step 21: determining a target number of total pixels of the target frame format; and Step 22: generating the output clock according to the target number and an input vertical synchronization signal of the display device.

In the step 21, the target number of total pixels is equal to the sum of a respective amount of active pixels and inactive pixels of the target frame format. The target frame format includes a plurality of horizontal lines each of which includes a plurality of pixels. Therefore, the target number of total pixels of the target frame format is equal to (N−1)*H+P, where N is the total number of the plurality of horizontal lines; H is the total number of pixels (including active and inactive pixels) of one complete horizontal line; and P is the number of pixels of the last horizontal line. The P is not larger than the H.

In an ideal condition, The P is equal to the H. However, in some practical conditions, the P is usually not equal to the H so as to achieve "frame synchronization". The frame synchronization means that the input frame rate is equal to the output frame rate. Generally speaking, the timing constraint of most panels is that the value of P must be a multiple of two or four. In a preferred embodiment, the display controller generates the output clock having a period such that the value of P is equal to that of H or a multiple of two or four.

In the step 22, the period of the generated output clock is substantially equal to the period of the input vertical synchronization signal divided by the target number of total pixels of the target frame format. Utilizing the input vertical synchronization signal can achieve the frame synchronization. That is, the input time of an input frame (i.e., the period of the input vertical synchronization signal) is equal to the display time of an output frame (i.e., the product of the period of the output clock and the amount of total pixels of the output frame). Furthermore, the frequency of the output clock is adjusted according to the input vertical synchronization signal such that the format of the output frame is substantially fixed and is substantially equal to the target frame format. That is, the format of the output frame is substantially fixed to the format of "(N−1)*H+P", which is equal to the target number of total pixels. In this manner, the instability of the format of the output frame, which may result from the drift of the output clock or the input vertical synchronization signal, can be avoided. In the step 22, the output clock is generated by phase-locked loop (PLL) or a delay-locked loop (DLL). In one embodiment, a digital phase-locked loop (DPLL) is used to generate the output clock, as shown in FIG. 3.

Figure 3:
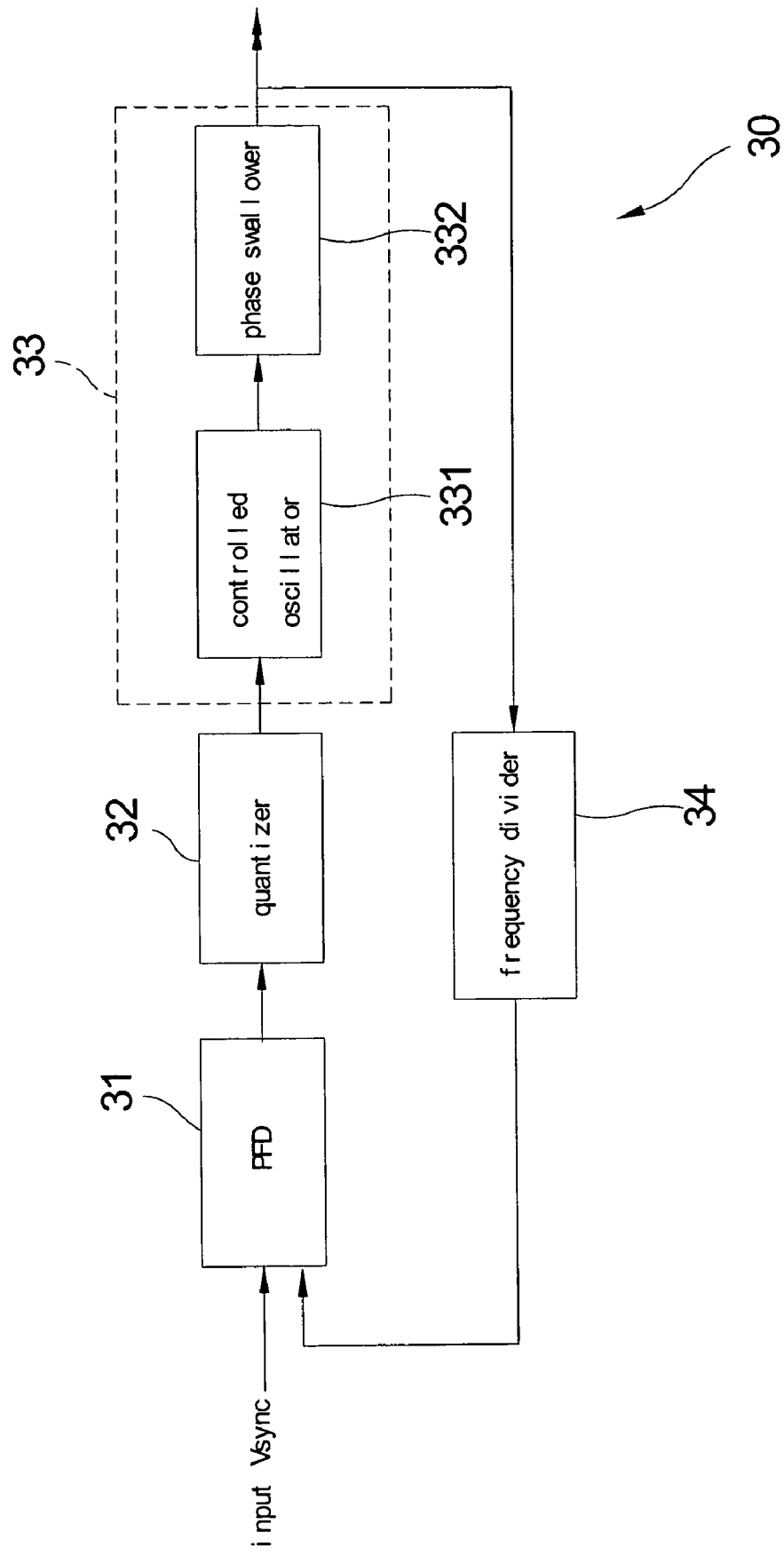
FIG. 3 illustrates a block diagram of a preferred embodiment of the output clock generator according to the present invention.

In FIG. 3, the digital phase-locked loop 30 includes a phase-frequency detector (PFD) 31, a quantizer 32, a direct digital synthesizer 33, and a frequency divider 34. In an embodiment, the direct digital synthesizer 33 includes a controlled oscillator 331 (digital controlled oscillator (DCO) or a numerical controlled oscillator (NCO)) and a phase swallower 332. The DPLL 30 receives the input vertical synchronization signal (Vsync), and generates the output clock, which is also feedback to the PFD 31 via the frequency divider 34. The frequency divider 34 executes the frequency division on the output clock according to the target number of total pixels of the target frame format. Utilizing the architecture of DPLL 30, the frequency of the output clock can track the input vertical synchronization signal. That is, when the input vertical synchronization signal has a drift, the frequency of the output clock will be changed accordingly such that the amount of total pixels of the output frame will remain fixed (i.e., equal to the target number of total pixels) and the amount of pixels of the last horizontal line of the output frame will be equal to those of other horizontal lines or a multiple of two or four. In this manner, the designer of the display device can control the display controller to generate the output clock so as to conform to the timing constraint of a panel. In another embodiment, the phase swallower 332 can be omitted.

Figure 4:
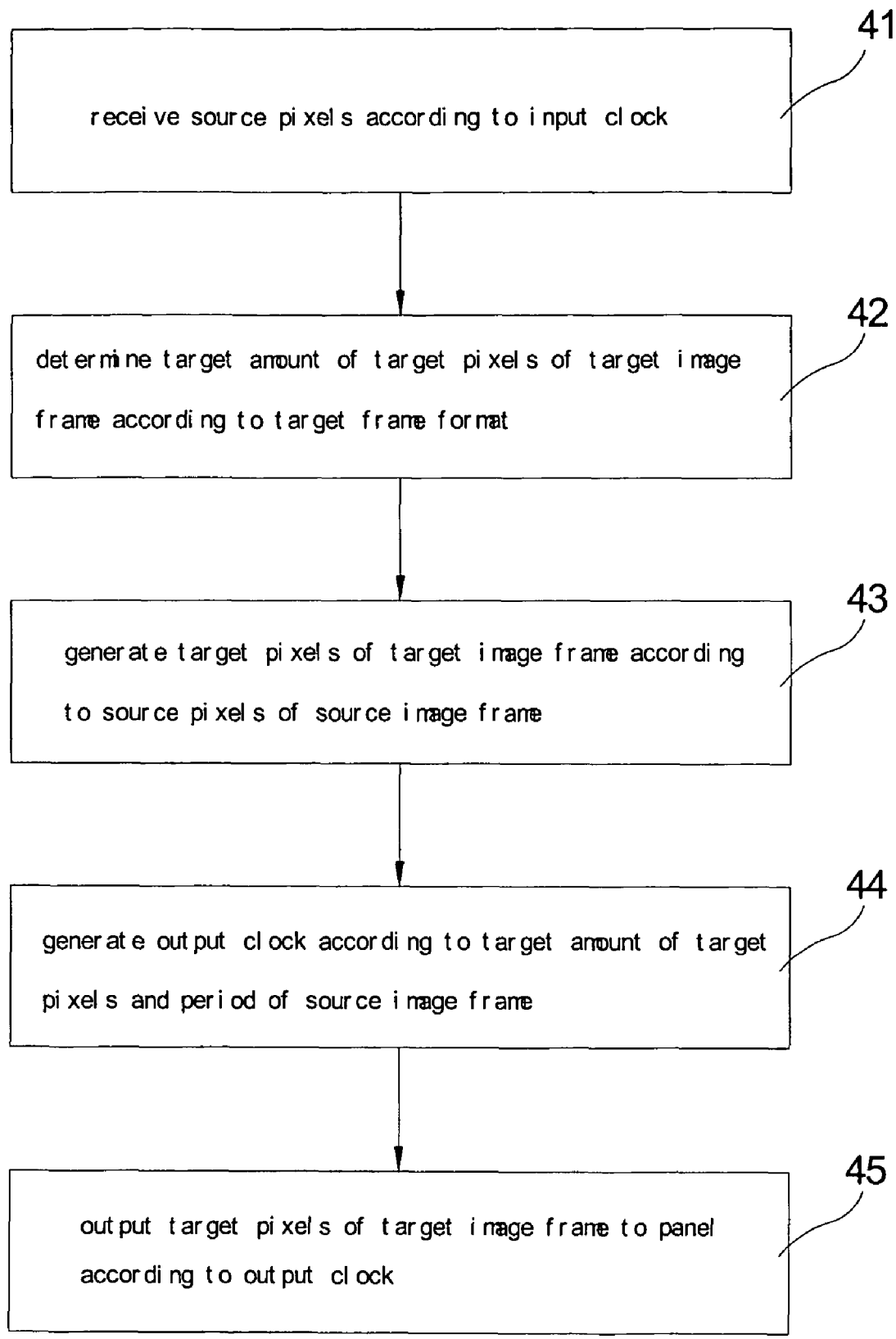
FIG. 4 illustrates a flowchart of a preferred embodiment of the method for generating a target image frame according to a source image frame according to the present invention.

FIG. 4 illustrates a flowchart of a preferred embodiment of the method for generating a target image frame according to a source image frame according to the present invention. The flowchart comprises the steps of:

Step 41: receiving the source pixels according to an input clock;

Step 42: determining a target amount of the target pixels of the target image frame according to a target frame format;

Step 43: generating the target pixels of the target image frame according to the source pixels of the source image frame;

Step 44: generating an output clock according to the target amount of the target pixels and a period of the source image frame; and Step 45: outputting the target pixels of the target image frame to the panel according to the output clock.

In the step 44, by adjusting the frequency of the output clock according to the period of the source image frame, the frame synchronization can be achieved, that is, the average period of the source image frame and that of the target image frame are substantially the same. In the step 45, the target pixels are outputted according to the output clock such that the frame format of the target image frame is kept substantially fixed and is substantially equal to the target frame format. More specifically, the output clock has a period such that the amount of target pixels of the last target horizontal line is substantially the same in a time span of a series of target image frames. In a preferred embodiment, the predetermined frame format is corresponding to a timing constraint of the panel, and the period of the output clock also enables the format of the target image frame to conform thereto.

In an embodiment, in order to conform to various timing constraints, the output clock is generated (e.g. by the DPLL 30 of FIG. 3) to have a clock period such that the value of P (i.e. the amount of pixels of the last horizontal line) is equal to H (i.e. total number of pixels of one complete horizontal line) or a multiple of two or four.

In another embodiment, the step 42 determines the target amount of the target pixels according to a timing constraint of the panel, and the step 44 generates the output clock according to the target amount of the target pixels and a period of the source horizontal line.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. A method for generating an output clock for outputting received image data to a panel, the method comprising:
   determining a target frame format and a target number of total pixels of the target frame format, wherein the target frame format comprises a plurality of active and inactive pixels arranged as a plurality of horizontal lines, and the target number of total pixels conforms to a timing constraint of the panel such that when a last target horizontal line of the plurality of target horizontal lines is not a complete horizontal line, the number of target pixels of the last target horizontal line is set equal to a multiple of four;
   generating an output clock according to the target number of total pixels and an input vertical synchronization signal;
   outputting the received image data to the panel according to the output clock; and
   adjusting a frequency of the output clock in response to variation of a period of the input vertical synchronization signal such that a period of the output clock is kept substantially equal to the period of the input vertical synchronization signal divided by the target number of total pixels;
   wherein an output frame format of the received image data is kept substantially equal to the target frame format so as to conform to the timing constraint of the panel.

2. The method of claim 1, wherein the step of adjusting the frequency of the output clock comprises:
   performing a frequency division on the output clock according to the target number; and
   comparing the frequency-divided output clock and the input vertical synchronization signal to generate a new output clock recursively.

3. The method of claim 2, wherein the frequency of the output clock is adjusted by a digital phase-locked loop (DPLL).

4. A method for generating a target image frame according to a source image frame, the source image frame comprising a plurality of source pixels arranged as a plurality of source horizontal lines, the target image frame comprising a plurality of target pixels arranged as a plurality of target horizontal lines, both the source and target pixels comprising a plurality of active pixels and inactive pixels, the method comprising:
   examining a last target horizontal line to determine a timing constraint of a panel, the timing constraint specified according to how a number of pixels in a last target horizontal line is adjusted if the last target horizontal line is incomplete;

determining a target amount of the target pixels of the target image frame according to the determined timing constraint of the panel generating the target pixels according to the source pixels;

generating an output clock according to the target amount of the target pixels of the target image frame and a frame period of the source image frame; and outputting the target pixels to the panel according to the output clock to generate the target image frame such that the generated target image frame substantially conforms to the determined timing constraint of the panel.

5. The method of claim 4, wherein a frequency of the output clock is adjusted such that a period of the output clock is kept substantially equal to the frame period of the source image frame divided by the target amount of the target pixels of the target image frame.

6. The method of claim 5, wherein the frequency of the output clock is adjusted such that an average frame period of the source image frame and that of the target image frame are substantially the same.

7. The method of claim 4, wherein an amount of the target pixels of the last target horizontal line is the same in a time span of at least two target image frames.

8. A method for generating an output clock for outputting received image data to a panel, the method comprising:

determining a timing constraint of the panel, the timing constraint defined according to how a number of pixels in a last horizontal line is regulated if the last horizontal line is incomplete;

determining a target number of total pixels of a target format according to the timing constraint of the panel; wherein the target format comprises a plurality of horizontal lines;

generating an output clock according to the target number of total pixels and an input vertical synchronization signal; and outputting the received image data to the panel according to the output clock such that an output frame format of the received image data is substantially equal to the target format.

9. The method of claim 8, further comprising:

adjusting a frequency of the output clock according in response to variation of a period of the input vertical synchronization signal such that a period of the output clock is kept substantially equal to the period of the input vertical synchronization signal divided by the target number of total pixels.

10. The method of claim 9, wherein the step of adjusting the frequency of the output clock comprises:

performing a frequency division on the output clock according to the target number; and comparing the frequency-divided output clock and the input vertical synchronization signal to generate the output clock.

11. The method of claim 9, wherein the frequency of the output clock is adjusted by a digital phase-locked loop (DPLL).

* * * * *